United States Patent
Carroll et al.

[11] Patent Number: 5,920,146
[45] Date of Patent: Jul. 6, 1999

[54] ELECTRODE EDGE WAVE PATTERNS FOR PIEZOELECTRIC RESONATOR

[75] Inventors: Beverly A. Carroll, Marengo; Weiping Zhang, Arlington Heights; Sang Kim, Cicero, all of Ill.

[73] Assignee: Motorola Inc., Schaumburg, Ill.

[21] Appl. No.: 08/869,895

[22] Filed: Jun. 5, 1997

[51] Int. Cl.⁶ .................................................. H01L 41/08
[52] U.S. Cl. ........................................... 310/365; 310/312
[58] Field of Search .................................. 310/311, 365, 310/312, 326

[56] References Cited

U.S. PATENT DOCUMENTS

| | | | |
|---|---|---|---|
| 4,211,947 | 7/1980 | Ikeno et al. | 310/312 |
| 4,218,631 | 8/1980 | Yamguchi | 310/312 |
| 4,370,584 | 1/1983 | Ikeno et al. | 310/365 |
| 4,468,582 | 8/1984 | Fujiwara et al. | 310/312 |
| 4,564,782 | 1/1986 | Ogawa | 310/359 |
| 4,672,591 | 6/1987 | Breimesser et al. | 367/152 |
| 5,117,147 | 5/1992 | Yoshida | 310/320 |
| 5,414,321 | 5/1995 | Schropp et al. | 310/313 R |
| 5,578,974 | 11/1996 | Yang et al. | 333/187 |

FOREIGN PATENT DOCUMENTS

| | | | |
|---|---|---|---|
| 54-138392 | 10/1979 | Japan | 310/365 |
| 59-174010 | 2/1984 | Japan | 310/365 |

*Primary Examiner*—Mark O. Budd
*Attorney, Agent, or Firm*—Brian M. Mancini

[57] ABSTRACT

A piezoelectric resonator (10) with electrodes (14) having a periodic pattern (28) along a portion of an edge (30) of at least one of the electrodes (26). The periodic pattern (28) has a periodicity that destructively interferes with the undesirable vibrational mode. For example, a rectangular AT-cut quartz resonator, which vibrates in a thickness-shear mode may also possess undesirable flexure and face-shear modes. These modes not only present undesirable spurious frequencies, they also change over temperature, disturbing a frequency-temperature response (16) of the quartz crystal. The periodic pattern (28) substantially reduces these undesirable modes, providing a more uniform frequency-temperature response which is beneficial in temperature compensated crystal oscillator applications.

6 Claims, 4 Drawing Sheets

ELECTRODE EDGE WAVE PATTERNS FOR PIEZOELECTRIC RESONATOR

FIELD OF THE INVENTION

The present invention relates generally to piezoelectric devices and, in particular, to electrode patterns on piezoelectric resonators for providing signals with improved temperature performance.

BACKGROUND OF THE INVENTION

Piezoelectric crystals have been used for many decades as frequency control elements in radio communication devices because of their stable resonant frequency signal generation during operation. The resonant frequency of a particular piezoelectric crystal is dependent on its vibrational mode of operation, its thickness, the density, and the elastic coefficients of material. Each of these parameters vary with changes in temperature. Therefore, the resonant frequency of the piezoelectric crystal changes with temperature.

There are no piezoelectric angle cuts that provide perfectly flat frequency-temperature curves (i.e. a curve demonstrating no frequency variation over a particular temperature range of interest). However, there are several known cuts of quartz that thermally compensate the crystal blank to have a relatively stable temperature performance. These include the AT, BT, GT and SC cuts, among others. Of these, the AT-cut is the predominantly used cut and ideally exhibits a frequency-temperature curve for a thickness-shear vibrational mode which should be recognized by those skilled in the art as the familiar Bechmann curve. The AT-cut also should ideally exhibit a substantially uniform resistance-temperature curve.

In practice, undesired vibrational modes arise in piezoelectric crystals, such as AT-cut quartz for example, that disturb the frequency-temperature and/or resistance-temperature performance of the crystal. These undesired vibrational modes cause disturbances, or "activity dips", in the frequency-temperature and/or resistance-temperature curves of the crystal. This results in a sudden and undesirable shift in frequency and/or resistance as the crystal changes temperature. This problem occurs in about 2–7% of AT-cut quartz crystals and causes serious difficulties for temperature compensation schemes and circuitry required to normalize the temperature variation of the quartz crystal, such as in a temperature compensated crystal oscillator (TCXO) application, for example.

An example of undesirable vibrational modes are face-shear and flexure modes that have frequencies near that of the desired thickness-shear vibrational mode. These undesirable modes exhibit their own frequency-temperature and/or resistance-temperature curves which are typically much steeper than the Bechmann curve. Where these curves intersect the Bechmann curve, vibrational coupling occurs which disturbs the Bechmann response. These disturbances, or activity dips, distort the frequency-temperature and/or resistance-temperature curves such that typical temperature compensation schemes can no longer compensate the higher-order perturbations caused by the activity dips.

There is a need for a piezoelectric resonator with a reduction of activity dips in a frequency-temperature and/or resistance-temperature curve, that can be realized in a simple, readily manufacturable form, at a low cost and high yield.

DETAILED DESCRIPTION OF THE PREFERRED EMBODIMENT

The present invention provides a specific electrode design, for a piezoelectric resonator, which destructively interferes with undesirable vibrational modes having frequencies that are close to a desired operating frequency. The electrodes, as disposed on a piezoelectric plate, have an edge wave patterns which are of a periodicity that does not support undesired vibrational modes.

Figure 1:
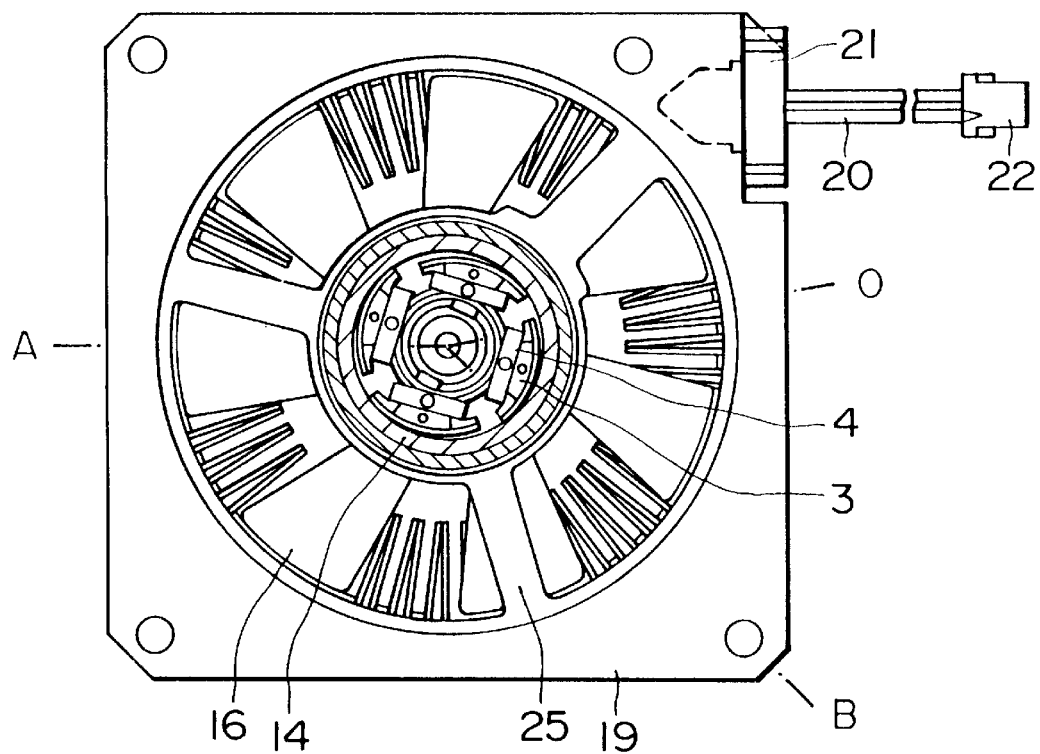
FIG. 1 shows a top plan view of a prior art piezoelectric resonator.

FIG. 1 shows a top view of a prior art piezoelectric resonator 10 which includes a piezoelectric substrate 12 with a disposed rectangular electrode 14. Typically, the resonator 10 is a AT-cut strip quartz blank with dimensions of about 188 mils (4.8 mm) in length by about 95 mils (2.4 mm) in width by about 5 mils (0.13 mm) thick, and the electrode 14 has dimensions of about 95 mils (2.4 mm) in length by about 65 mils (1.65 mm) in width. A bottom electrode (not shown) is of the same dimensions as the disposed electrode 14 and is overlapped by the disposed electrode 14.

For the AT-cut quartz example having a width in a crystallographic X-direction and a length in a crystallographic Z'-direction, the electrodes are used to drive a thickness-shear mode of vibration at a desired frequency. The frequency exhibits a substantially third-order frequency-temperature response commonly known as a Bechmann curve. A fundamental thickness-shear frequency of the resonator is about 13.0 MHz. However, undesirable vibration modes such as, but not limited to, face-shear modes and flexure modes also exist near 13.0 MHz, for example. These are the modes that are of concern since only nearby frequency modes will adversely affect the thickness-shear mode over temperature.

The above undesirable modes couple to the desired thickness-shear mode over a predetermined range of temperatures causing a disturbance, or "activity dip", in the frequency-temperature response. It has been observed that these undesirable modes affect about 2–7% of a population of resonators, depending on the particular frequency model type being produced. This is a major problem in radio communication devices which require stable performance.

In general, resonators used in radio communication devices require some type of temperature compensation to maintain frequency stability to within ±5 ppm or less over a predetermined range of temperatures, typically −30° C. to 85° C. or more. In addition, the resonators are required to maintain a stable resistance due to the minimum current drain requirements of radios. If the resistance of a resonator rises above a certain level, the radio may stop working.

To save size, cost and current, oscillator manufacturers use the simplest possible schemes to temperature compensate resonators. The majority of these schemes include either an analog type which provides a circuit with an inverse Bechmann (3rd order) function to compensate the Bechmann curve of the resonator, or a digital type which divides the Bechmann curve into temperature segments and normalizes each segment to a nominal frequency. The analog type suffers where high-order (over 3rd order) perturbations are present in the Bechmann curve. In these cases, the perturbation could not be compensated in any manner. The digital type suffers where large frequency variations exist within the chosen temperature segment. In this case, if the variation within the temperature segment is greater than the required limit (±5 ppm for example), then the oscillator will not meet the specification.

Although it is possible for one of the existing compensation schemes to sufficiently correct a frequency perturbation so as to meet a radio specification, neither of the analog or digital schemes address resistance perturbations. This is a major disadvantage since resistance activity dips can cause a radio to stop working completely, whereas frequency shifts may still allow the radio to operate, albeit in a diminished capacity.

Figure 2:
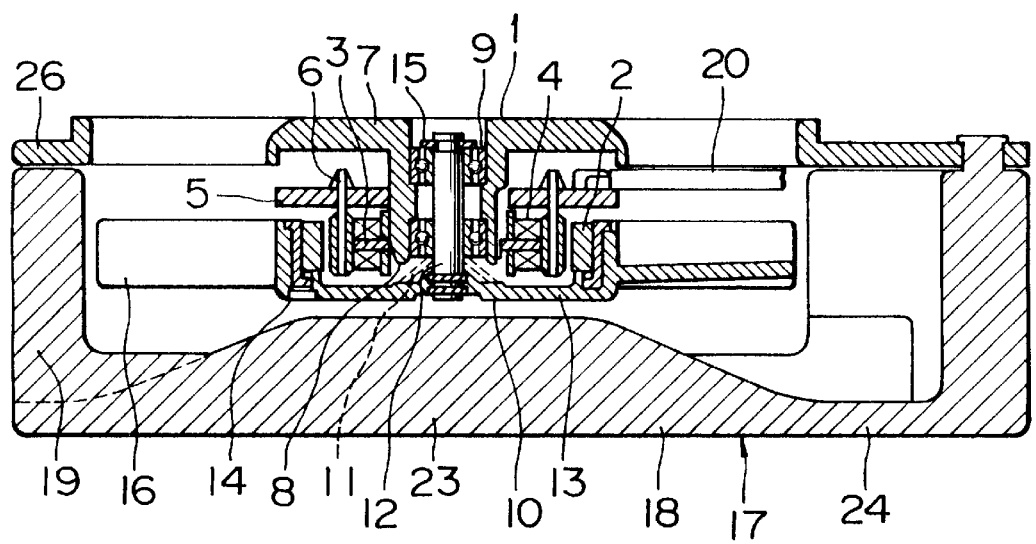
FIG. 2 shows a graphical representation of an activity dip in a response of the piezoelectric resonator of FIG. 1.

FIG. 2 shows a graph of a frequency-temperature (Bechmann) curve 16, a resistance-temperature curve 17, and a delta deviation curve 19 of a prior art AT-cut quartz resonator that has been disturbed by an activity dip 18. The delta deviation curve 19 describes the deviation of the frequency-temperature curve from an ideal third-order Bechmann response. This parameter is important for those customer applications that have a temperature compensation algorithm limited to third-order terms.

As can be seen, the activity dip 18 causes a spike in the resistance-temperature curve 17 such that the resistance of the resonator increases from 33 ohms at 27° C. to a high of about 49 ohms at 89° C. There is nothing that a radio designer can do to compensate for this resistance. Therefore, if the resistance goes above a certain level, the resonator can no longer be used. In a resonator without activity dips the resistance can be expected to remain stable to within a few ohms across the entire temperature range.

Also, the activity dip 18 can disturb the frequency-temperature performance of the resonator from an ideal Bechmann response, as demonstrated by the delta deviation curve 19 which shows a deviation from the ideal Bechmann response by about ±0.9 ppm near 85° C. For a ±5 ppm radio application using a third-order temperature compensation algorithm which can not compensate for this delta deviation, it would be necessary to actually provide ±4.1 ppm of temperature compensation to meet the ±5 ppm specification. In reality, this situation is even worse where radio designers wedge their specifications to accommodate possible measurement errors. The presence of activity dips places serious constraints on a radio application and directly results in reduced yields. In a resonator without activity dips the delta deviation can be expected to remain below about ±0.2 ppm across the entire temperature range.

The desired mode of vibration in a piezoelectric blank, such as an AT-cut quartz crystal for example, is a thickness-shear vibration. This can be visualized as a wave extending in a thickness direction of the blank with the two major surfaces of the plate moving perpendicular to the thickness of the plate. One of the major surfaces moves in an opposite perpendicular direction from the other major surface of the plate. Of the undesired vibration modes, the face shear mode can be visualized as a wave in the width-length plane of the blank propagating along a length direction of the blank. The flexure mode can be visualized as a wave in the thickness-width plane of the blank propagating along a width direction of the blank. However, the flexure mode also has a vibrational component in the length direction of the blank. The present invention provides dampening of the face-shear and flexure modes.

Figure 3:
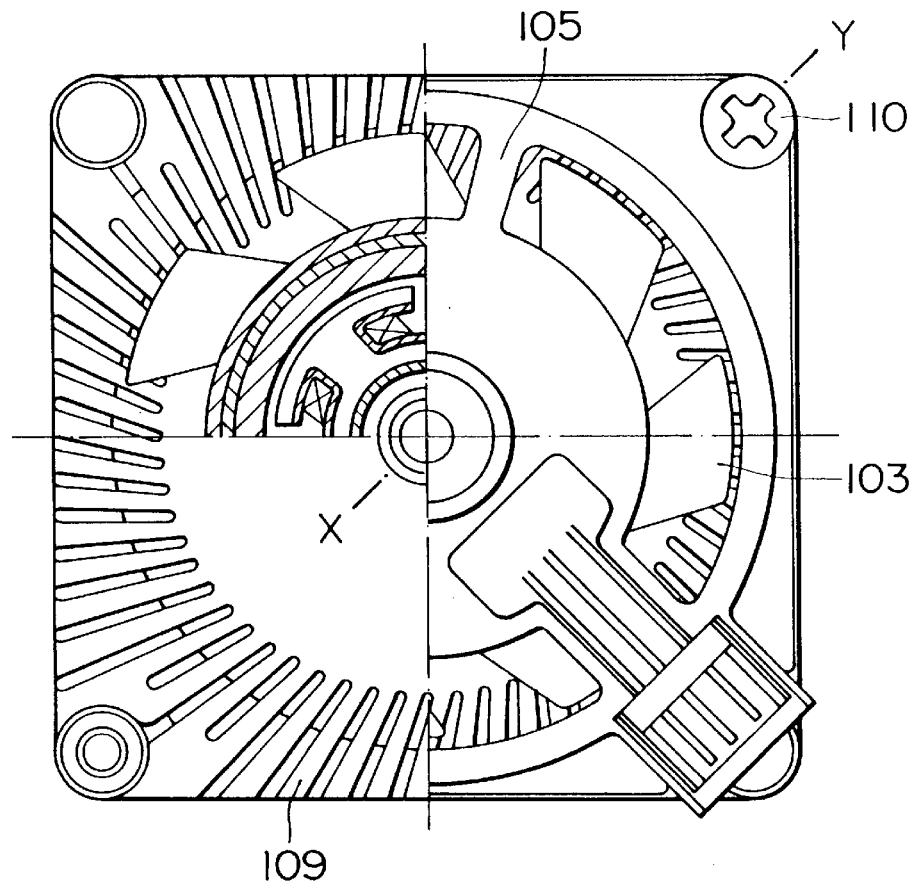
FIG. 3 shows a top plan view of a first embodiment of a piezoelectric resonator, in accordance with the present invention.

FIG. 3 shows a first embodiment of the present invention including a piezoelectric resonator 20 having a piezoelectric plate 22 having an upper surface 24 and a lower surface. The plate 22 is the same as is used in the prior art resonator of FIG. 1. In the first embodiment, an upper electrode 26 is disposed on the upper surface 24 of the plate 22 and a lower electrode (not shown) is disposed on the lower surface of the plate. Preferably, the upper electrode 26 and lower electrode are situated centrally on the plate, opposite from each other and substantially aligned. However, these are not requirements of the invention. The electrodes could extend substantially to the plate edges, or could be located off center, either mutually or independently.

At least one of the upper and lower electrodes have a first periodic pattern 28 along a portion of a first edge 30 of the at least one of the upper and lower electrode. When the electrode is biased or energized by an AC signal, the first periodic pattern 28 causes destructive interference with an undesirable vibrational mode of the piezoelectric plate 22. The desired mode, such as a thickness-shear mode, is not affected because it is primarily trapped in the middle of the width of the plate. The undesirable vibrational mode includes, but is not limited to, at least one of the group consisting of flexure modes and face-shear modes. Destructive interference is provided having the periodic pattern 28 of a different wavelength than those of the flexure or face-shear modes.

Preferably, the upper and lower electrodes are substantially opposing and have substantially the same periodic pattern. The periodic pattern 28 is shown along a length direction 32 of the electrode 26. However, the periodic pattern 28 could also be located along a width direction 38 of the electrode 26, or on a portion of both the length and width of the electrode. It should be noted that the principle of using electrode edge wave patterns in the present invention can be extended to shapes which deviate slightly from rectangular or are substantially non-rectangular (e.g. round, oval, square, polygonal, hybrid or irregular shapes) plates and electrodes, also. In addition, the periodic pattern could appear on an edge of a void within the edge boundaries of the electrode plating. However, having an opening in the electrode plating could degrade the desired operating mode.

In a preferred embodiment the piezoelectric plate is a quartz crystal plate and, in particular, an AT-cut quartz plate. An AT-cut resonator, when energized by an AC signal, drives a desired thickness-shear mode of vibration within the quartz plate.

The periodic pattern can take on any waveshape such as square, triangular, sawtooth, alternating semi-circles, sinusoidal, etc. Also, the pattern could include a combination of different wavelengths, amplitudes, or waveshapes, and can includes gaps with no pattern. Preferably, the first periodic pattern is of a sinusoidal waveshape since this does not generate energy-wasting harmonics and most closely matches the naturally sinusoidal vibration modes. It is also envisioned that an ascending or descending wavelength within the wave pattern can be used to cover a specific range of wavelengths and frequencies. It is also possible to superimpose several waveforms of differing wavelengths along a portion of an edge of an electrode in order to generate a particular desired set of responses.

One of the novel aspects of the present invention is that it uses a wave pattern having a wavelength that is different than the wavelengths of those undesired vibrational modes having a frequency nearby that of a desired vibrational mode. Using a wave pattern with a wavelength the same as one of the undesired vibrational modes may constructively support that mode which is not desired. The present invention advantageously uses a wave pattern having a wavelength that is different than the wavelengths of nearby undesired vibrational mode thereby destructively interfering with those modes (e.g. face-shear or flexure modes, for example) reducing their impact on the desired mode (e.g. a thickness shear-mode in an AT-cut quartz resonator, for example).

Preferably, the first periodic has a first wavelength that is between the wavelengths of the group of undesirable vibrational modes, such as face-shear or flexure modes, for example. The wavelength of the first periodic pattern can be the average of all the wavelengths of the nearby undesired vibrational modes, or it can be a weighted average of all the nearby undesired vibrational modes, or most practically it can be a weighted average of the most dominant nearby undesired vibrational modes, particularly those modes which disturb the frequency-temperature or resistance-temperature response of the resonator.

Although, the wavelength of the first periodic pattern can match, and may therefore support, a wavelength of other vibrational modes, the frequency of those vibrational modes will not be close to the frequency of the desired vibrational mode (e.g. thickness-shear) so as to couple to and adversely disturb the desired frequency-temperature or resistance-temperature response.

Figure 4:
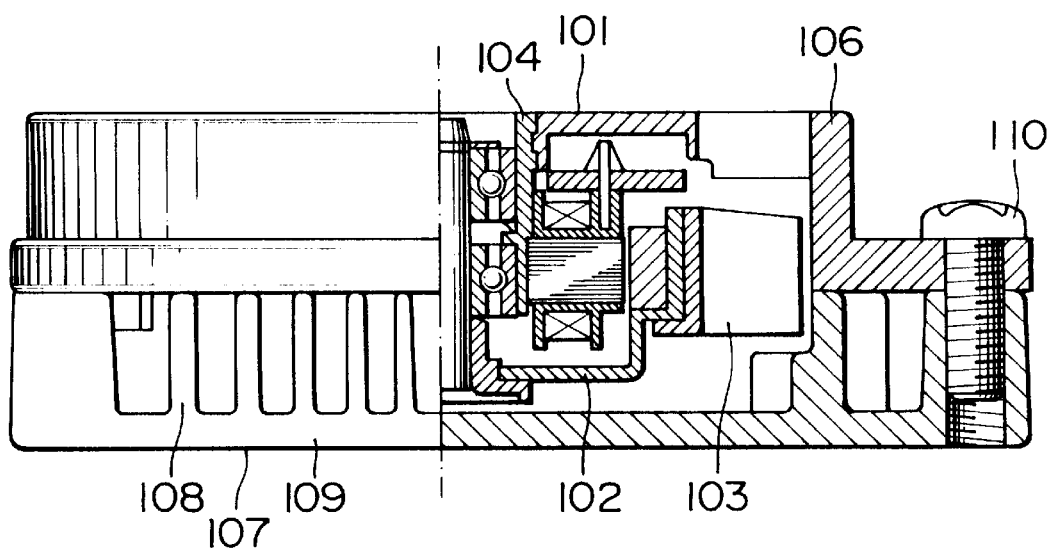
FIG. 4 shows a top plan view of a second preferred embodiment of a piezoelectric resonator, in accordance with the present invention.

FIG. 4 shows a second and preferred embodiment of the present invention which includes at least one electrode being generally rectangular with a first periodic pattern 28 substantially along a first edge 30 in a length direction 32 of the plate 22 and a second periodic pattern 34 substantially along an opposite second edge 36 in a length direction 32 of the plate 22. Preferably, the first periodic pattern 28 is offset about one-quarter wavelength from the second periodic pattern 34 along the length direction 32 of the plate 22. A quarter wavelength offset serves to discourage any off-frequency undesired modes (e.g. face-shear and flexure) that have a wavelength near that of the first periodic pattern. Such modes contribute to spurious frequency modes which could adversely affect potential customer applications, even though these modes are away from a desired mode and frequency (e.g. thickness-shear) and would not affect the Bechmann curve.

Alternatively, the first and second periodic patterns could have different wavelengths to address different undesired vibrational modes. Moreover, the first and second periodic patterns could have different amplitudes as needed to diminish an undesirable mode.

In a more preferred embodiment, the upper and lower electrodes have corresponding and aligned first and second periodic patterns, respectively. More particularly, the electrode patterns are the same and are aligned.

Figure 5:
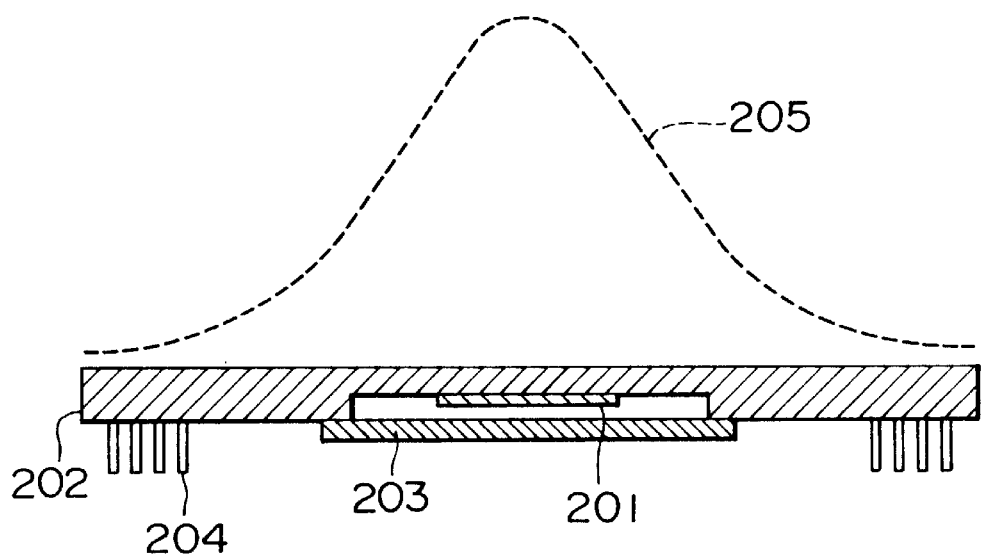
FIG. 5 shows a top plan view of a third embodiment of a piezoelectric resonator, in accordance with the present invention.

FIG. 5 shows a third embodiment of the present invention which incorporates all the limitations of FIG. 4, which is hereby incorporated by reference. In this third embodiment, the at least one electrode 26 includes a third periodic pattern 40 along a portion of a third edge 42 in a width direction 38 of the plate 22, and a fourth periodic pattern 44 along a portion of an opposite fourth edge 46 in the width 38 direction of the plate 22. This is useful in cases were a specific undesired vibrational mode has a predominant effect in a width direction 38 of the plate 22. These cases can be addressed by the third and fourth periodic patterns 40, 44 independently of an undesired vibrational mode having a predominant affect in a length direction 32 of the plate 22 which are addressed by the first and second periodic patterns 28, 34.

In particular, this embodiment includes the first and second periodic patterns have a first periodicity, and the third and fourth periodic patterns have a second periodicity such that, when the electrodes are energized by an AC signal, the first and second periodic patterns cause destructive interference with a first undesirable vibrational mode and the third and fourth periodic patterns cause destructive interference with a second undesirable vibrational mode. Moreover, at least one of the first and second periodic patterns or the third and fourth periodic patterns could be offset by one-quarter wavelength for the reasons stated earlier.

For example, in a rectangular AT-cut quartz resonator having a width in the X-direction and a length in a Z-direction, or a width in the Z-direction and a length in a X-direction, the first and/or second periodicity is chosen to be at a wavelength away from a periodicity of an undesired face-shear vibrational mode which is nearby a desired thickness-shear vibrational mode. Whereas, the second periodicity is chosen to be at a wavelength away from a periodicity of an undesired flexure vibrational mode which is nearby a desired thickness-shear vibration mode, also.

In an alternative embodiment, the periodic patterns could have any combination of different periodicities to address undesired vibrational modes in either of a corresponding length or width direction of the plate. This can include differences in wavelengths between corresponding edges of the upper and lower electrodes. Moreover, the periodic patterns can take on any waveshape such as square, triangular, sawtooth, alternating semi-circles, sinusoidal, etc. Preferably, the periodic patterns are of a sinusoidal shape since this does not generate energy-wasting harmonics and most closely matches the naturally sinusoidal vibration modes. The patterns could also have ascending or descending wavelengths within the wave pattern which can be used to cover a specific range of wavelengths and frequencies. It is also possible to superimpose several waveforms of differing wavelengths along a portion of any of the periodic patterns in order to generate a particular desired set of responses.

In addition, the periodic patterns could have any combination of different amplitudes to address undesired vibrational modes of differing magnitudes. This can include differences in amplitude of wave patterns between corresponding edges of the upper and lower electrodes. The patterns could also have ascending or descending amplitudes within the wave pattern to cover a specific range of magnitudes.

Figure 6:
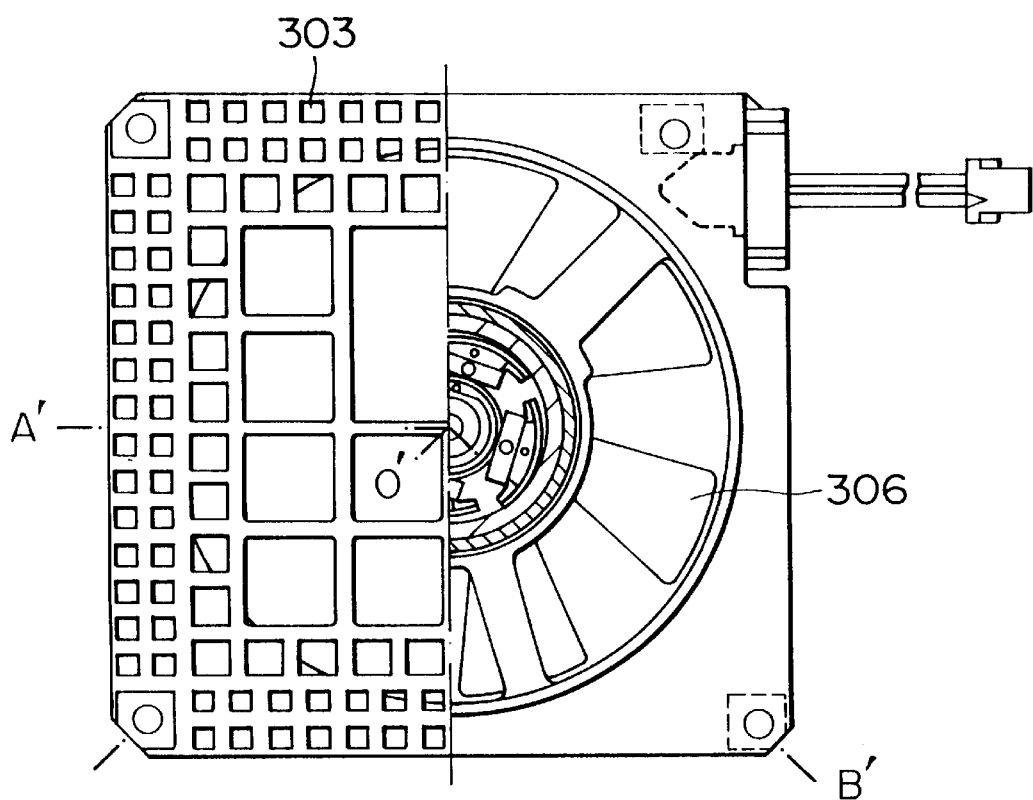
FIG. 6 shows a communication device incorporating a piezoelectric resonator, in accordance with the present invention.
Figure 7:
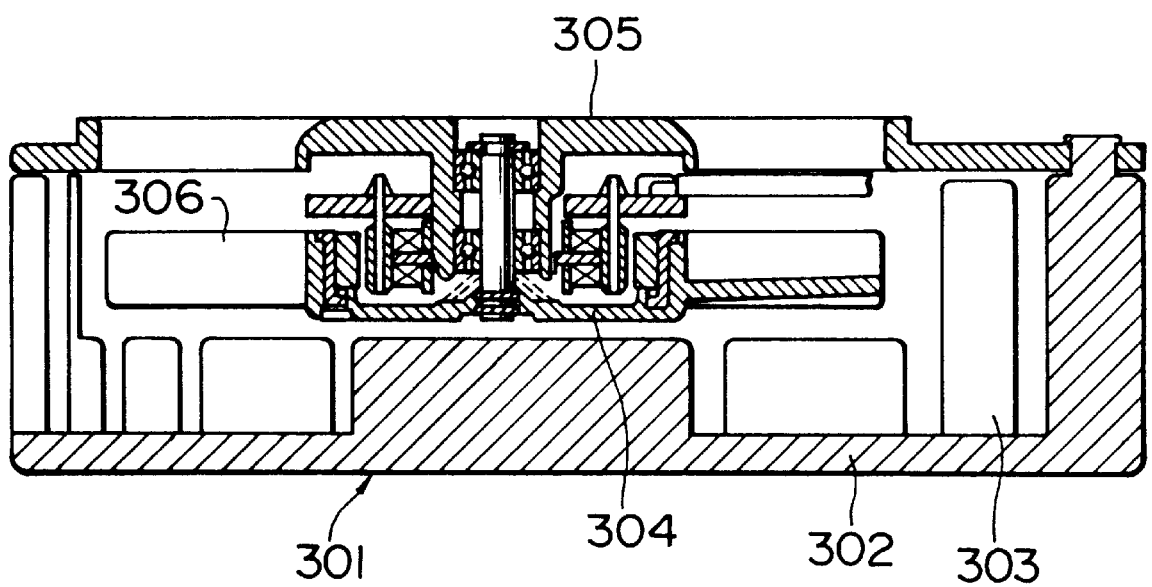
Figure 3:
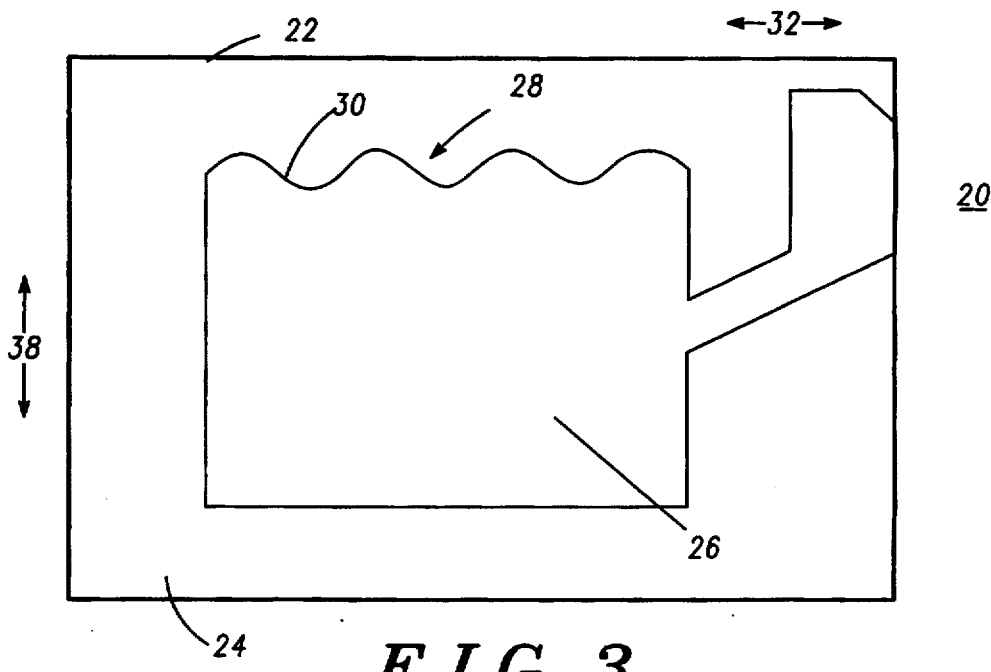
Figure 4:
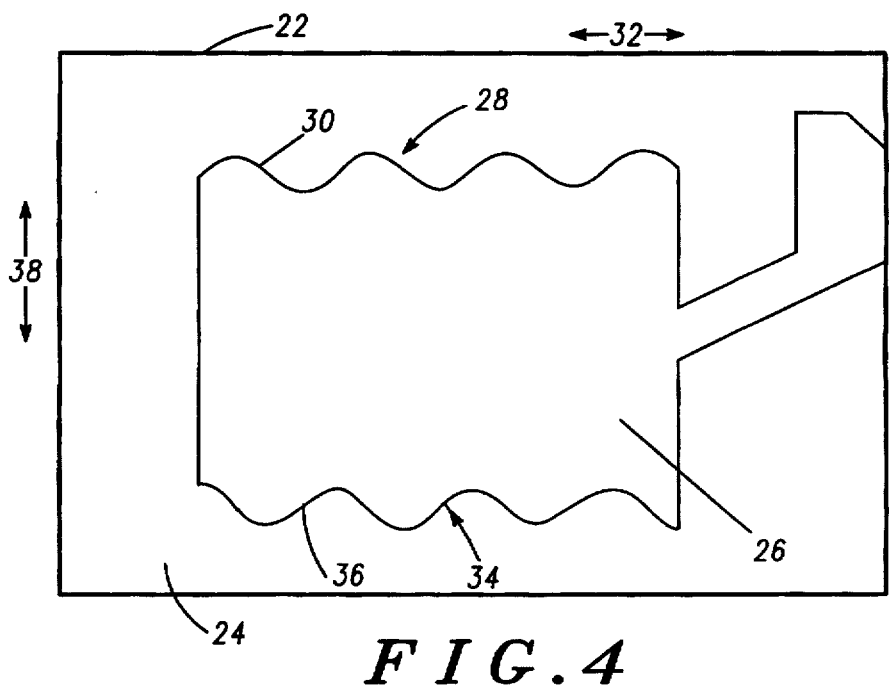
Figure 5:
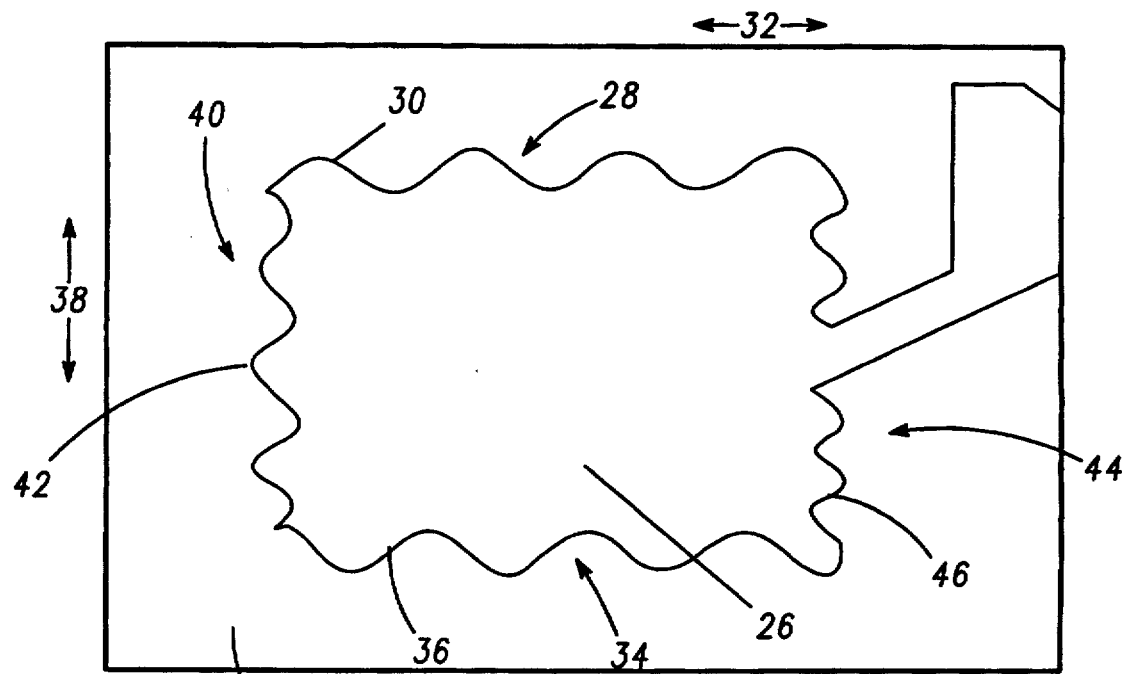
Figure 6:
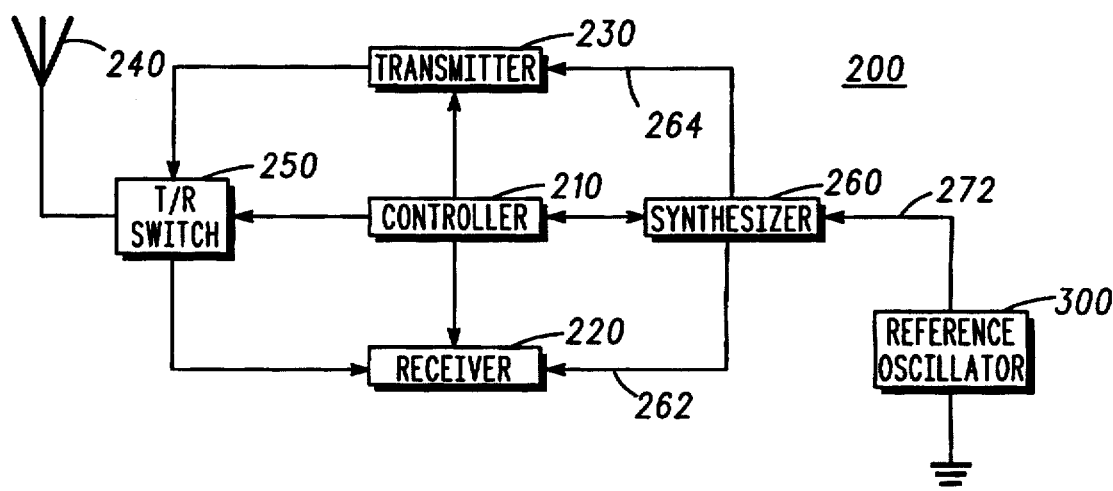

FIG. 6 shows a block diagram of a communication device 200 which includes a temperature compensated crystal oscillator (TCXO) circuit as a reference oscillator 300. The TCXO circuit utilizes a quartz resonator, in accordance with the present invention. In one embodiment, the communication device 200 is a well known frequency synthesized two-way transceiver which operates under the control of a controller 210. The communication device 200 includes a receiver 220 and a transmitter 230 which receive and transmit RF via an antenna 240. The antenna 240 is appropriately coupled between the receiver 220 and the transmitter 230 by a duplexer or an antenna switch 250. The communication device 200 also includes a well known phase locked loop synthesizer 260 which, under the control of the controller 210, provides a receiver local oscillator signal 262 and a transmitter local oscillator signal 264. The reference oscillator 300 includes the quartz resonator of the present invention and provides a reference signal 272 for the synthesizer 260. The reference signal 272 is generated utilizing the principles of the present invention.

Comparative Example

The following experimental results serve to give an illustration of the practice of this invention, and are not intended in any way to limit the scope of this invention.

Several experiments were conducted to empirically determine the frequency-temperature responses of a group of AT-cut rectangular quartz resonators utilizing the principles of the present invention. A group of resonators were constructed on AT-cut strip quartz blanks with dimensions of about 188 mils (4.8 mm) in length by about 95 mils (2.4 mm) in width by about 5 mils (0.13 mm) thick. The blanks were electroded and mounted with conductive epoxy in standard surface mount packages, followed by testing the resonators over temperature, all using processes known in the art. The electrodes had dimensions of about 95 mils (2.4 mm) in length by an average width of about 65 mils (1.65 mm). The resonators had a frequency of about 13 MHz.

As is known in the art, a piezoelectric body will support vibration modes along an edge that have an integral number of half wavelengths, with nodes being one-quarter wavelength in from each respective edge, and every one-half wavelength thereafter. For example, the wavelength of a desired thickness-shear vibration is:

$$\lambda_{TS} = 2t/n \ (n=1, 3, 5 \ldots)$$

where t is the thickness of the blank (at one-half wavelength) and n is the overtone mode of operation. In AT-cut quartz this relationship can also be defined in terms of the acoustic wave velocity of quartz. The acoustic wave velocity of a thickness-shear wave in quartz is known to be about 3300 m/sec. Therefore, the wavelength of a desired thickness-shear vibration is:

$$\lambda_{TS} = (3300 \text{ m/sec})/nf \ (n=1, 3, 5 \ldots)$$

where f is the fundamental frequency of the blank and n is the overtone mode of operation. Therefore, for a 13 MHz AT-cut quartz blank for example, a thickness-shear wavelength of about 0.254 mm, or a blank thickness (one-half wavelength) of about 0.127 mm, is demonstrated. However, because quartz is anisotropic the acoustic wave velocity of quartz is different in different directions. Fortunately, we are only concerned with undesirable frequency modes that are near to the desired frequency mode. Therefore, the frequency of the undesired modes is approximately known.

The wavelength of the face-shear and flexure modes that are near in frequency to the thickness shear mode are defined by their associated acoustic wave velocities. It is calculated that the acoustic wave velocity of the face-shear mode is about 4808 m/sec, and the acoustic wave velocity of the flexure mode is about 2702 m/sec. It is not necessary to obtain exact relationships for these modes since the present invention serves to avoid these frequencies, and the exact frequency of the undesired modes will be rounded off to the nearest half-wavelength supported by a length or width of the blank. Therefore, the wavelength of the face-shear mode at the same frequency as a desired thickness-shear mode will be about 145% (4808/3300) of the thickness-shear wavelength, and the wavelength of the flexure mode at the same frequency as a desired thickness-shear mode will be about 82% (2702/3300) of the thickness-shear wavelength, or $$\lambda_{FS} \approx 1.45 \ \lambda_{TS}$$

and $$\lambda_F \approx 0.82 \ \lambda_{TS}$$

For example, in an AT-cut quartz blanks of the above dimensions:

$\lambda_{TS} = 0.254$ mm
$\lambda_{FS} \approx 0.370$ mm
$\lambda_F \approx 0.208$ mm However, the blank will only support an integer multiple of half-wavelengths. For the face-shear mode along the 4.8 mm length of the blank $$4.8 \text{ mm}/\lambda_{FS} = 12.97 \text{ wavelengths}$$

Therefore, the length of the blank will most likely support a face-shear frequency having 13 or 12.5 wavelengths, which is close enough to the desired thickness-shear frequency to cause activity dips as the two frequencies shift at different rates over temperature. The frequency of an exact 13 wavelength face-shear mode along the 4.8 mm length of the blank is about $$(4808 \text{ m/sec})/(4.8 \text{ mm}/13) = 13.022 \text{ MHz}$$

For the flexure mode along the 2.4 mm width of the blank $$2.4 \text{ mm}/\lambda_F = 11.54 \text{ wavelengths}$$

Therefore, the width of the blank will most likely support a flexure frequency having 11.5 or 12 wavelengths, which is close enough to the desired thickness-shear frequency to cause activity dips as the two frequencies shift at different rates over temperature. The frequency of an exact 11.5 wavelength flexure mode along the 2.4 mm width of the blank is about $$(2702 \text{ m/sec})/(2.4 \text{ mm}/11.5) = 12.947 \text{ MHz}$$

However, the flexure mode also has a second vibration component in the length direction of the blank. This flexure-length mode can be described as:

$$\lambda_{FL} = l/k \ (k=1,2,3,4 \ldots)$$

where l is the length of the blank and k is the harmonic overtone of the flexure-length component. It is believed that the flexure-length component is an important element in coupling to and disturbing the temperature performance of the thickness-shear mode, and in particular the second and third harmonics of the flexure-length component which have a wavelength that is much greater than the face-shear mode.

For k=2 the wavelength of the flexure-length component is 4.8 mm/2=2.4 mm, and for l=3 the wavelength of the flexure-length component is 4.8 mm/3=1.6 mm. This is in addition to the flexure mode which propagates in the width direction. It is believed that the electrode edge wave pattern serves to break up the flexure wave propagating in the width direction and to destructively interfere with the second and third harmonic of the flexure-length component.

It is desired to choose a wavelength of the edge wave periodic pattern of the electrode that is not equal to a wavelength of the face-shear and flexure modes, or any of their local harmonic or subharmonic modes. This prevents possible constructive interference with those undesired modes, and provides destructive interference to reduce those undesired modes.

For the face-shear mode and flexure modes the undesirable subharmonic mode wavelengths are:

$\lambda_{FS}$=0.37 mm, 0.74 mm, 1.11 mm . . .

$\lambda_{F}$=0.21 mm, 0.42 mm, 0.84 mm . . .

and for the flexure-length component the undesirable second and third harmonic mode wavelengths are:

$\lambda_{FL}$=2.4 mm, 1.2 mm, 0.8 mm, 0.6 mm . . . and $\lambda_{FL}$=1.6 mm, 0.8 mm, 0.53 mm, 0.4 mm . . .

For practical reasons a wavelength of the edge wave pattern of the electrode was chosen that is between the maximum (2.4 mm) and the minimum (0.26 mm) of the undesired wavelengths so as to destructive interfere with both undesired modes and to give a sufficient number of easily patterned wavelengths along the edge of the electrode to be useful. In order to provide destructive interference, the wavelength of the edge wave pattern was chosen to be away from any of the above harmonics of the undesirable modes. The above collection of harmonic modes show a concentration of five modes from 0.37 mm to 0.6 mm, and another concentration of four modes from 0.74 mm to 0.84 mm. The wavelength for the electrode edge wave pattern was chosen to be between these two concentration of modes; about 0.69 mm (3½ wavelengths along the edge of the electrode).

The upper and lower electrodes were configured as shown in FIG. 3, with the same wavelength edge wave pattern of 0.69 mm along each overlapping length edge of each electrode, with the wave pattern along one edge being offset from the wave pattern on the opposite edge by one-quarter wavelength. In this configuration the upper and lower electrodes had identical configurations. In addition, the amplitude of the edge wave patterns was chosen to be 0.09 mm, or one-quarter of the edge wave wavelength.

About forty resonators with the above wave edge pattern were constructed and compared to a group of controls having straight-edged rectangular electrodes of the dimensions listed above for FIG. 1. The resonators were temperature tested in a frequency range of –35° C. to 105° C. at 5° C. intervals. The resonators were measured for three parameters, maximum resistance, maximum delta deviation (the maximum amount the frequency-temperature response varies from an ideal 3rd-order Bechmann curve), and average delta deviation (an average of the frequency-temperature response deviations from an ideal 3rd-order Bechmann curve at each temperature interval).

Table 1 shows a comparison of the results between the experimental and control groups.

TABLE 1

| Test category | highest | lowest | median |
|---|---|---|---|
| Control group | | | |
| Maximum resistance (ohms) | 68 | 12 | 15 |
| Max. delta deviation (ppm) | 0.530 | 0.020 | 0.080 |
| Avg. delta deviation (ppm) | 0.085 | 0.005 | 0.015 |
| Experimental group | | | |
| Maximum resistance (ohms) | 38 | 20 | 25 |
| Max. delta deviation (ppm) | 0.220 | 0.020 | 0.080 |
| Avg. delta deviation (ppm) | 0.060 | 0.005 | 0.020 |

As can be seen, the experimental group shows a tighter distribution of values (i.e., range between the highest and lowest values). In addition, the highest numbers in the experimental group are lower than the highest numbers in the control group in all test categories. Advantageously, this results in less production rejects.

It was also found that the amplitude of the wave pattern could vary about ±50% with acceptable results. Amplitudes larger or smaller than this degraded the effectiveness of the present invention.

Although, these results were obtained with an AT-cut crystal at 13 MHz, it is envisioned that this approach could be successfully used at other frequencies or with various other piezoelectric devices having undesirable vibrational modes that are near to a desirable vibrational mode. In addition, the present invention could be used to reduce spurious frequency modes nearby a desired mode, notwithstanding temperature considerations. Moreover, it is contemplated that the present invention can be expanded to incorporate a destructively interfering wave pattern directly into a portion of the edge or surface of the piezoelectric plate itself, particularly if techniques to provide such an pattern became practical.

In the present invention, a significant improvement is obtained in frequency-temperature performance of a quartz AT-cut resonator, using existing equipment and techniques. In addition, the present invention advantageously provides a resistance-temperature response which is better than existing resonators. In summary, the present invention provides a piezoelectric resonator which exhibits good frequency stability over a large temperature range with a uniform resistance response which improves the performance of a radio communication device that incorporates the present invention.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A piezoelectric resonator, comprising:

a piezoelectric plate having an upper and a lower surface;

an upper electrode disposed on the upper surface of the plate;

a lower electrode disposed on the lower surface of the plate, the upper and lower electrodes being of similar sizes and being generally rectangular; and at least one of the upper and lower electrodes having a first periodic pattern along a portion of a first edge of the at least one electrode in a length direction of the plate, a second periodic pattern along a portion of an opposite second edge in a length direction of the plate, a third periodic pattern along a portion of a third edge in a width direction of the plate, and a fourth periodic pattern along a portion of an opposite fourth edge in the width direction of the plate, such that the periodic patterns of the electrode, when energized by an AC signal, cause destructive interference with an undesirable vibrational mode of the piezoelectric plate.

2. The resonator of claim 1, wherein the first and second periodic patterns have a first periodicity, and the third and fourth periodic patterns have a second periodicity such that, when the electrodes are energized by an AC signal, the first and second periodic patterns cause destructive interference with a first undesirable vibrational mode and the third and fourth periodic patterns cause destructive interference with a second undesirable vibrational mode.

3. The resonator of claim 2, wherein the first periodicity is different from a periodicity of an undesired face-shear vibrational mode.

4. The resonator of claim 3, wherein the first periodicity is about 27 mm, and the undesired face-shear vibrational mode has a periodicity of about 10 mm.

5. The resonator of claim 2, wherein the second periodicity is different from a periodicity of an undesired flexure vibrational mode.

6. The resonator of claim 5, wherein the second periodicity is about 27 mm, and the undesired flexure vibrational mode has a periodicity ranging from about 62 to about 94 mm.

* * * * *

UNITED STATES PATENT AND TRADEMARK OFFICE
CERTIFICATE OF CORRECTION

PATENT NO. : 5,920,146
DATED : July 6, 1999
INVENTOR(S) : Beverly A. Carroll, et al.

It is certified that error appears in the above-identified patent and that said Letters Patent is hereby corrected as shown below:

Title page,
Showing the illustrative figure, should be deleted and substitute therefor the attached title page.

The drawing sheets consisting of Figs. 1-6, should be deleted to be replaced with the drawing sheets consisting of Figs. 1-6, as shown on the attached page.

Signed and Sealed this

Thirtieth Day of October, 2001

Attest:

*Nicholas P. Godici*

NICHOLAS P. GODICI
*Attesting Officer*     *Acting Director of the United States Patent and Trademark Office*

United States Patent [19]  
Carroll et al.

[11] Patent Number: 5,920,146  
[45] Date of Patent: Jul. 6, 1999

[54] ELECTRODE EDGE WAVE PATTERNS FOR PIEZOELECTRIC RESONATOR

[75] Inventors: Beverly A. Carroll, Marengo; Weiping Zhang, Arlington Heights; Sang Kim, Cicero, all of Ill.

[73] Assignee: Motorola Inc., Schaumburg, Ill.

[21] Appl. No.: 08/869,895

[22] Filed: Jun. 5, 1997

[51] Int. Cl.$^6$ .................................. H01L 41/08
[52] U.S. Cl. ............................ 310/365; 310/312
[58] Field of Search ........................ 310/311, 365, 310/312, 326

[56] References Cited

U.S. PATENT DOCUMENTS

| | | | |
|---|---|---|---|
| 4,211,947 | 7/1980 | Ikeno et al. | 310/312 |
| 4,218,631 | 8/1980 | Yamguchi | 310/312 |
| 4,370,584 | 1/1983 | Ikeno et al. | 310/365 |
| 4,468,582 | 8/1984 | Fujiwara et al. | 310/312 |
| 4,564,782 | 1/1986 | Ogawa | 310/359 |
| 4,672,591 | 6/1987 | Breimesser et al. | 367/152 |
| 5,117,147 | 5/1992 | Yoshida | 310/320 |
| 5,414,321 | 5/1995 | Schropp et al. | 310/313 R |
| 5,578,974 | 11/1996 | Yang et al. | 333/187 |

FOREIGN PATENT DOCUMENTS

| | | | |
|---|---|---|---|
| 54-138392 | 10/1979 | Japan | 310/365 |
| 59-174010 | 2/1984 | Japan | 310/365 |

Primary Examiner—Mark O. Budd  
Attorney, Agent, or Firm—Brian M. Mancini

[57] ABSTRACT

A piezoelectric resonator (10) with electrodes (14) having a periodic pattern (28) along a portion of an edge (30) of at least one of the electrodes (26). The periodic pattern (28) has a periodicity that destructively interferes with the undesirable vibrational mode. For example, a rectangular AT-cut quartz resonator, which vibrates in a thickness-shear mode may also possess undesirable flexure and face-shear modes. These modes not only present undesirable spurious frequencies, they also change over temperature, disturbing a frequency-temperature response (16) of the quartz crystal. The periodic pattern (28) substantially reduces these undesirable modes, providing a more uniform frequency-temperature response which is beneficial in temperature compensated crystal oscillator applications.

6 Claims, 3 Drawing Sheets

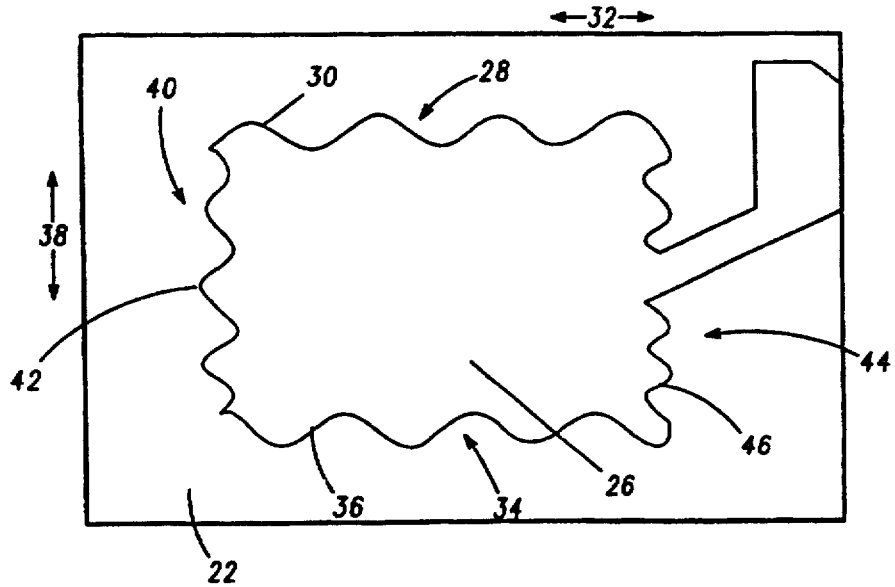

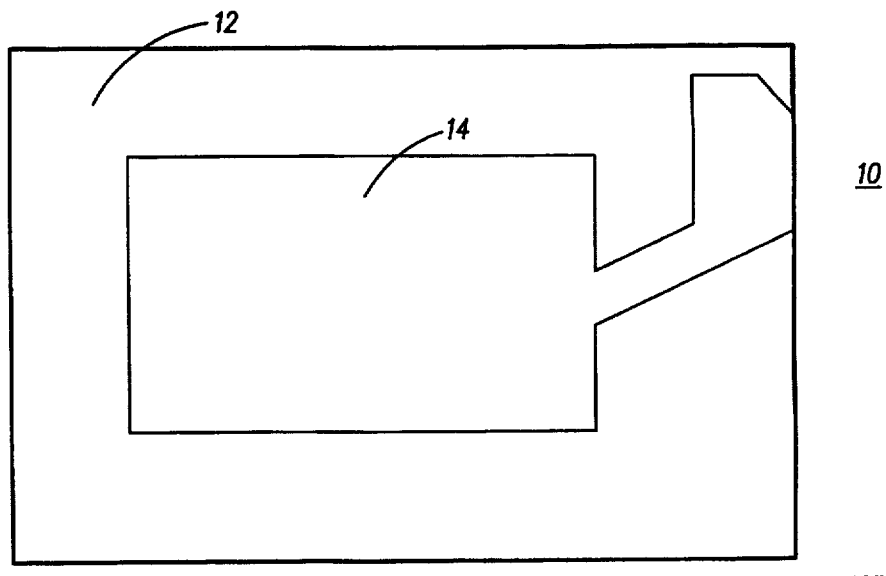
FIG. 1 —PRIOR ART—
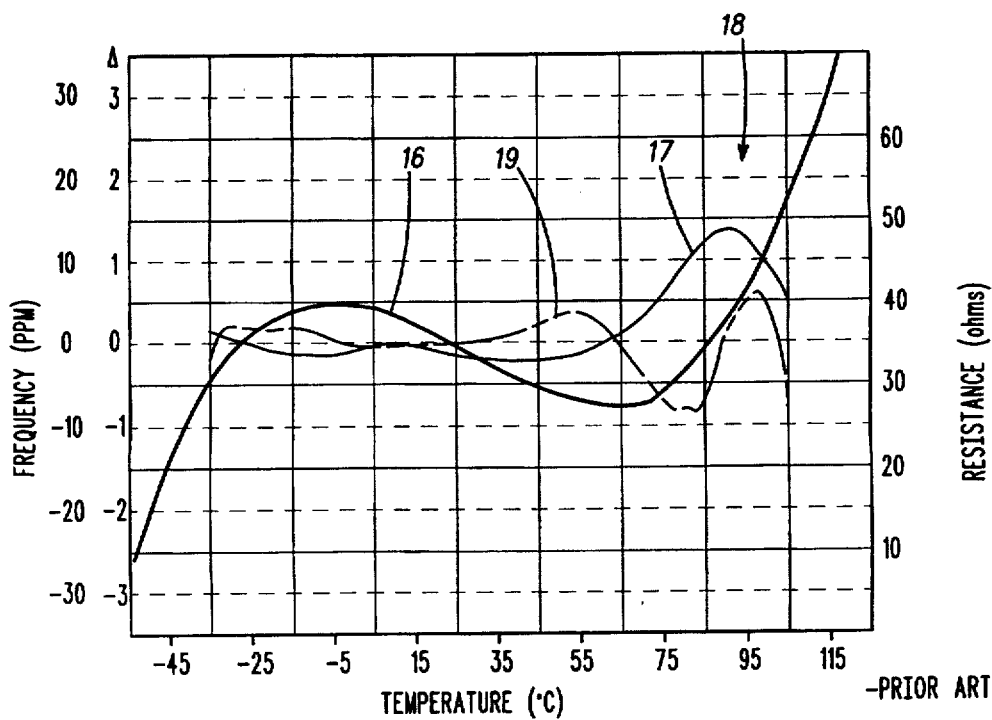
FIG. 2 —PRIOR ART—